United States Patent [19]

Corley

[11] Patent Number: 5,032,451

[45] Date of Patent: Jul. 16, 1991

[54] BISBENZOCYCLOBUTENE/BISIMIDE COMPOSITIONS

[75] Inventor: Larry S. Corley, Houston, Tex.

[73] Assignee: Shell Oil Company, Houston, Tex.

[21] Appl. No.: 579,134

[22] Filed: Sep. 6, 1990

Related U.S. Application Data

[62] Division of Ser. No. 359,001, May 30, 1989, Pat. No. 4,973,636.

[51] Int. Cl.$^5$ .................. D04H 1/58; B32B 27/12
[52] U.S. Cl. .................. 428/289; 428/290; 526/262
[58] Field of Search ............ 428/289, 290; 526/262

[56] References Cited

U.S. PATENT DOCUMENTS

| | | | |
|---|---|---|---|
| 4,540,743 | 9/1985 | Kirchhoff | 526/284 |
| 4,570,011 | 2/1986 | So | 560/8 |
| 4,642,329 | 2/1987 | Kirchhoff et al. | 526/284 |
| 4,661,193 | 4/1987 | Kirchhoff et al. | 156/307.3 |
| 4,687,823 | 8/1987 | Kirchhoff et al. | 526/284 |
| 4,711,964 | 12/1987 | Tan et al. | 548/461 |
| 4,730,030 | 3/1988 | Hahn et al. | 526/262 |
| 4,795,827 | 1/1989 | Bruza et al. | 564/329 |

FOREIGN PATENT DOCUMENTS 86-100718 10/1986 European Pat. Off.

OTHER PUBLICATIONS

Fan et al., "High-Temperature Thermosetting Resins . . . ," *Polymer Preprints* 27, pp. 453–454 (1986).
Denny et al., "Characterizations . . . ," *Polymer Preprints* 28, pp. 656–659 (1987).
Fan et al., "Benzocyclobutene in Polymer Synthesis III . . . ," *J. of Polymer Sci.* 26, pp. 3103–3117 (1988).
Fan and Arnold, "New High-Temperature Thermoset Systems," *Polymer Preprints* 26, pp. 176–177 (1985).
Fan and Arnold, "Thermoset Resin Systems," *Polymer Preprints* 26, pp. 178–179 (1985).
Fan and Arnold, "New Cure Chemistry . . . ," 1986, SAMPE Symposium, pp. 968–976.

*Primary Examiner*—Joseph L. Schoffer
*Assistant Examiner*—Alex H. Walker

[57] ABSTRACT

A class of benzocyclobutene/bisimide copolymers having superior toughness are disclosed. The copolymers are derived from bisbenzocyclobutene monomers by one of structures

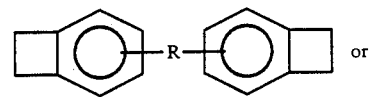 or

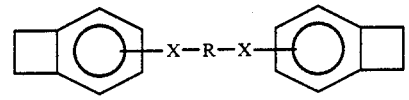

in which R is selected from unsubstituted and non-electrophilic substituted phenylene, naphthalenediyl and

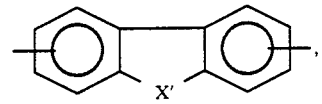

X is selected from oxygen, sulfur, nitrogen, —CH$_2$— and —C(CH$_3$)$_2$—; and X' is selected from O, S, N and —CH$_2$—. Also disclosed is a method for preparing a bisbenzocyclobutene/bisimide copolymer having a Tg greater than 200° C. and a Mode I fracture toughness greater than 2 MPa.m$^{\frac{1}{2}}$.

20 Claims, 1 Drawing Sheet

□ 250°C POSTCURE (WITH PHENOTHIAZINE)
○ 290°C POSTCURE (WITH PHENOTHIAZINE)
△ 290°C POSTCURE (WITHOUT PHENOTHIAZINE)

□ 250°C POSTCURE (WITH PHENOTHIAZINE)
○ 290°C POSTCURE (WITH PHENOTHIAZINE)
△ 290°C POSTCURE (WITHOUT PHENOTHIAZINE)

BISBENZOCYCLOBUTENE/BISIMIDE COMPOSITIONS

This is a division of application Ser. No. 359,001, now Patent No. 4,973,636, filed May 30, 1989.

BACKGROUND OF THE INVENTION

This invention relates to thermosettable resin compositions. In one embodiment, the invention relates to compositions containing a bismaleimide and a defined class of bisbenzocyclobutenes. In a specific embodiment, the invention relates to copolymers having superior toughness prepared by reacting a difunctional bismaleimide with a bisbenzocyclobutene having an aromatic linking group.

Advanced composites are high-performance materials made up of a fiber-reinforced thermoplastic or thermosettable material. Thermosettable materials useful in advanced composites applications must meet a set of demanding property requirements. For example, such materials optimally have good high-temperature properties such as high (above 200° C.) cured glass transition temperature and low (less than 3%) water absorption at elevated temperature. Such materials also exhibit high mechanical strength, as reflected in measurements of Mode I fracture toughness above 2 MPa.m$^{\frac{1}{2}}$ and good compression after impact. For ease of processing in preparing prepregs for composite parts, the uncured material will ideally have a low (below 120° C.) melting temperature.

Examples of thermosettable materials useful in advanced composites include epoxy resins, bisbenzocyclobutene resins and bismaleimide resins. Epoxy resins have good processing properties, but generally have relatively low glass transition temperatures and unacceptable high-temperature water absorbance, and they are also generally brittle.

Standard homopolymers of bisbenzocyclobutene resins (as described in the examples of U.S. Pat. No. 4,540,763) are brittle unless very high molecular weight resins are used. If very high molecular weight bisbenzocyclobutene resins are used, however, the materials are difficult to process into fiber-reinforced composites because of their high viscosity. Bismaleimide resins have this same disadvantage of brittleness and further tend to have high melting points and must be used with solvents in order to be readily processable. In addition, cured bismaleimide resins tend to have high (in the 5-7% range) water absorption. Copolymers of bisbenzocyclobutenes and bismaleimides as illustrated in the Example of U.S. Pat. No. 4,730,030 have good mechanical strength and heat resistance but, like the cured homopolymers, lack the necessary toughness for high-performance applications.

It is thus an object of the invention to provide a low-melting material which cures to a high-Tg, tough resin having low water absorption. In one embodiment, it is an object of the invention to prepare bisbenzocyclobutene/bismaleimide copolymers having Tg's above 200° C. and Mode I fracture toughness greater than 2 MPa.m$^{\frac{1}{2}}$.

SUMMARY OF THE INVENTION

Figure 1:
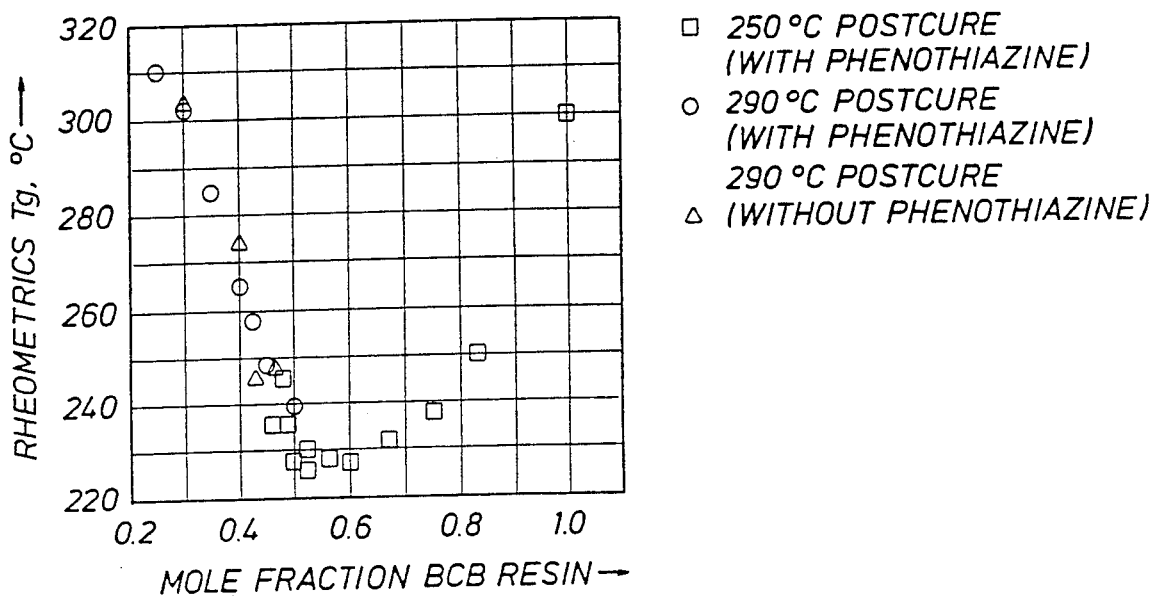
FIG. 1 is a plot of Tg versus mole fraction bisbenzocyclobutene for various bisbenzocyclobutene/bismaleimide copolymer compositions.

According to the invention, a composition is provided comprising a bisimide of an unsaturated dicarboxylic acid and a bisbenzocyclobutene which can be described by the formula

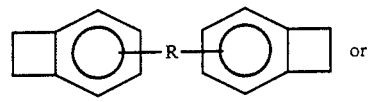 or

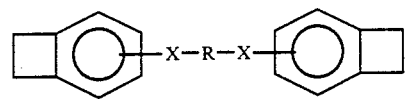

in which R is selected from unsubstituted and non-electron-withdrawing substituted phenylene, naphthalenediyl and

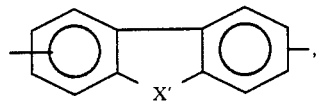

X is selected from oxygen, sulfur, nitrogen, —CH$_2$— and —C(CH$_3$)$_2$—, and X' is selected from O, S, N and —CH$_2$—. In a preferred embodiment, the invention composition is a copolymer product of thermally-initiated copolymerization of a difunctional bismaleimide and from about 0.6 to 2.5 moles, per mole of the bismaleimide, of a bisbenzocyclobutene as described above. The invention copolymers have superior toughness, exhibit low water absorption, and can be melt-processed for composites applications.

Also according to the invention, a method is provided for preparing a bisbenzocyclobutene/bisimide copolymer having a Mode I toughness (ASTM E 399-83 using 1×1×1/8" plaques) of greater than 2, the method comprising:

(a) providing a mixture of a bisimide monomer and a bisbenzocyclobutene monomer which can be represented by one of the formulas

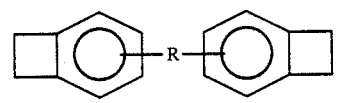 I

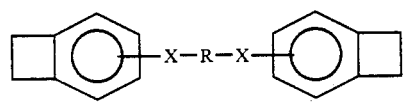 II

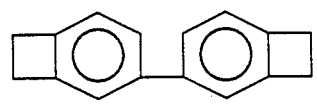 III in which R is selected from phenylene, naphthalenediyl, and

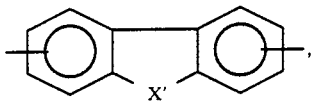

X is selected from oxygen, sulfur, nitrogen, —CH$_2$— and —C(CH$_3$)$_2$—; and X' is selected from O, S, N and —CH$_2$—;

(b) subjecting said monomer mixture to a temperature greater than (Tg$_u$–15° C.) for a time sufficient to produce essentially complete reaction of the monomers to form a copolymer.

DETAILED DESCRIPTION OF THE INVENTION

The invention composition includes a bisimide of an unsaturated dicarboxylic acid. The preferred bisimides are N,N'-bisimides of unsaturated dicarboxylic acids which can be represented by the formula

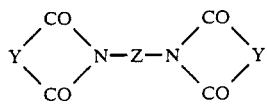

in which Y is a substituted or unsubstituted divalent group containing at least 2 carbon atoms, preferably 2 to 6 carbon atoms, and a carbon-carbon double bond, and Z is a divalent group containing at least 1 and generally about 1 to 40 carbon atoms. Z can be aliphatic, cycloaliphatic, aromatic or heterocyclic. A preferred class of bisimides comprises bismaleimides derived from aromatic amines and can be represented by the formula

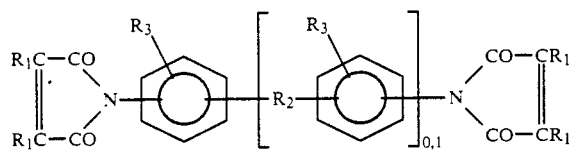

in which each R$_1$ is selected independently from H, C$_{1-2}$ alkyl or halide; R$_2$ is selected from divalent hydrocarbon radicals containing from about 1 to about 10 carbon atoms, —O—, —SO$_2$—, —COO—, —CONH—, —CO— and —S—; and each R$_3$ is selected independently from H, C$_{1-3}$ alkyl and halide.

Examples of such bisimides include
1,2-bismaleimidoethane
1,6-bismaleimidohexane
1,3-bismaleimidobenzene
1,4-bismaleimidobenzene
2,4-bismaleimidotoluene
4,4'-bismaleimidodiphenylmethane
4,4'-bismaleimidodiphenylether
3,3'-bismaleimidodiphenylsulfone
4,4'-bismaleimidodiphenylsulfone
4,4'-bismaleimidodicyclohexylmethane
3,5-bis(4-maleimidophenyl)pyridine
2,6-bismaleimidopyridine
1,3-bis(maleimidomethyl)cyclohexane
1,3-bis(maleimidomethyl)benzene
1,1-bis(4-maleimidophenyl)cyclohexane
1,3-bis(dichloromaleimido)benzene
4,4'-biscitraconimidodiphenylmethane
2,2-bis(4-maleimidophenyl)propane
1-phenyl-1,1-bis(4-maleimidophenyl)ethane
α,α-bis(4-maleimidophenyl)toluene
3,5-bismaleimido-1,2,4-triazole and various N,N'-bismaleimides disclosed in U.S. Pat. Nos. 3,562,223, 4,211,860 and 4,211,861. Bismaleimides can be prepared by methods known in the art, as described in U.S. Pat. No. 3,018,290, for example.

The bisimide resin can contain imide oligomer according to the formula

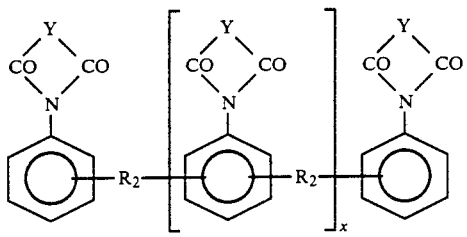

in which x is a number within the range of about 0 to about 0.5. Such oligomers may be present as an impurity in difunctional bisimides.

The preferred bisimide resin is N,N'-4,4'-diphenylmethane bismaleimide. The bisimide can contain various additives and modifiers as processing aids. The bisimide resin component can be a reaction product or prepolymer of a bisimide and an effective chain-extending agent such as an amine group-containing compound. Suitable amine group-containing compounds include diamines and polyamines represented by the general formula (H$_2$N)$_n$Q or (RNH)$_n$Q and aminophenols represented by the general formula (NH$_2$)$_n$Q(OH)$_n$ or (RNH)$_n$Q(OH)$_n$, in which Q is a divalent aromatic or alicyclic group and n is a number such that the average number of aminohydrogens per molecule in the amine mixture falls between about 1.95 and 2.5. Examples include bis(4-(N-methylamino)phenyl)methane, N,N'-dimethyl-1,3-diaminobenzene and the like. Such reaction products can be prepared by methods known in the art, such as contacting about 0.1 to about 0.8 mole of the chain-extending agent per mole of the bisimide in an organic solvent at a temperature of about 40° to 250° for a time of about 5 minutes to 5 hours. The bisimide can be, for example, a hydrazide-modified bisimide as described in U.S. Pat. No. 4,211,860 and 4,211,861. Suitable N,N'-unsaturated bismaleimide resins are commercially available from Technochemie GmbH as Compimide ® resins, for example.

The invention composition includes a bisbenzocyclobutene which can be described by one of formulas I and II:

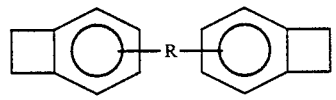

I or

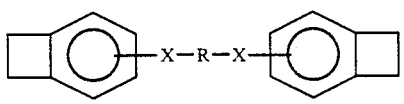

II in which R is selected from unsubstituted and non-electrophilic substituted phenylene, naphthalenediyl, and

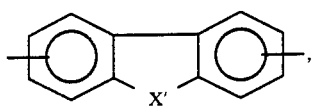

X is selected from oxygen, sulfur, nitrogen —CH$_2$— and —C(CH$_3$)$_2$—, and X' is selected from O, S, N and —CH$_2$—. Examples of R groups include o-, m- and p-phenylene, 2,7-naphthalenediyl and dibenzofurandiyl. The presently preferred bisbenzocyclobutene, because of the superior properties of the copolymer, can be defined by formula I above when R is 1,3-phenylene.

The bisbenzocyclobutene (BCB) and the bisimide (BI) are combined in a molar ratio of BCB:BI within the range of about 0.6:1 to about 2.5:1, preferably about 0.8:1 to about 1.3:1, most preferably about 0.9:1 to about 1.1:1, in order to achieve the desired physical properties in the copolymer.

Preparation of Bisbenzocyclobutene Monomers

The preparation of bisbenzocyclobutene monomers is known generally in the art, for example, U.S. Pat. No. 4,540,763 and U.S. Pat. No. 4,711,964, the methods of which can be adapted for certain of the bisbenzocyclobutene monomers of the present invention compositions. Preparation of diaryl ethers of bisphenols is described in Williams, Kenney and Bridger, *J. Org. Chem.*, 32, 2501–2502 (1967). Specifically, bis(benzocyclobutenyl)ethers of bisphenols can be synthesized by the Ullmann etherification of 4-bromobenzocyclobutene with a suspension of the disodium salt of a bisphenol such as resorcinol in refluxing pyridine (or an alkylpyridine) containing dissolved CuCl as a catalyst. The disodium salt of resorcinol is suitably prepared by the reaction of resorcinol with sodium methoxide in pyridine with the methanol removed as an azeotrope with pyridine. Similarly, arylene-bridged bisbenzocyclobutenes can be prepared by the reaction of benzocyclobutenyl Grignard reagent with dihaloarenes in the presence of various nickel or palladium compounds. This type of reaction is described in Kumada, *Pure Appl. Chem.*, 52, 669–679 (1980). Benzocyclobutenyl Grignard reagent may in turn be prepared by the reaction of 4-bromobenzocyclobutene with magnesium in tetrahydrofuran. Synthesis of specific bisbenzocyclobutenes is illustrated in Examples 1, 2 and 3 herein.

Preparation of Bisimide/Bisbenzocyclobutene Copolymers

The bisimide and bisbenzocyclobutene monomers may be combined in any manner desired, such as melt, solution or powder blending. The preferred technique involves melting a mixture of the solid monomers containing the desired quantities of each monomer at a temperature above the respective melting points but below the polymerization temperature of either monomer, and stirring the melt until a homogeneous mixture is achieved. The melt may also be held at temperatures above about 200° C. for desired periods of time in a process of prepolymerization to increase the crystallization resistance of the melt and/or to increase its viscosity to desired levels. The mixture can then be poured directly into a mold for polymerization, or it can be cooled for later polymerization.

Polymerization is effected by heating the mixture to a temperature effective to initiate opening of the benzocyclobutene rings to form a transient diene which rapidly reacts with available maleimide groups. This temperature is generally at least about 180° C., preferably about 210° to about 350° C., held for a time of about 2 hours or more (with the required cure time dependent on the temperature-staging program used).

In order to achieve the superior properties exhibited by the invention copolymers, a mixture of the monomers is heated at a temperature near (within 15° C. below) or above the ultimate, or fully-cured, glass transition temperature of the copolymer ($Tg_u$) for a time sufficient to produce essentially complete reaction of the monomers. "Essentially complete" reaction of the monomers has been reached when no further reaction exotherm is observed by differential scanning colorimetry (DSC) upon heating the copolymer. The time of the heat treatment, or "post-cure," will vary depending upon the monomers, the degree of pressure applied and any precuring of the monomer mixture at temperatures lower than about ($Tg_u$–15° C.). Preferably, this post-cure is at or above the ultimate Tg, most preferably at least 20° C. above $Tg_u$, but will always be lower than the temperature at which degradation of the copolymer will occur.

The Copolymers

The cured bisimide/bisbenzocyclobutene copolymers are characterized by glass transition temperatures (dynamic mechanical) generally above about 200° C., Mode I toughness (ASTM E 399-83 using $1 \times 1 \times 1/8''$ samples) greater than about 2.0 MPa.m$^{\frac{1}{2}}$, preferably greater than about 2.5, most preferably greater than about 3.0, and water absorption (93° C.) less than about 3%, preferably less than about 2.0%. Methyl ethyl ketone absorption (room temperature) is less than about 3% in the preferred species.

The copolymers are useful as resin matrices for composites in aerospace and electronics applications, including large structural parts and circuit boards. Based on their long shelf life and relatively low melting point, some of the uncured mixtures are useful for making tacky prepregs which can then be molded into composites. They are also suitable for low-solvent or solventless liquid resin processing methods such as filament winding, resin transfer molding and pultrusion if the mixtures are heated to provide sufficiently low viscosity for fiber impregnation.

The described compositions have certain characteristics in common which distinguish the prior art compositions which are the subject, for example, of U.S. Pat. No. 4,730,030 and U.S. Pat. No. 4,711,964. First, to achieve the properties desired in the present invention compositions designed for composites applications, the R group of the bisbenzocyclobutene monomer must not have reactive carbon-carbon double or triple bonds which could be the source of undesired crosslinking, or electron-withdrawing substituents such as NO$_2$, C=O, P=O, SO$_2$, quaternary ammonium or halide. It is also undesirable for the R group to contain predominantly flexible moieties, such as flexible alkyl chains, for example. It is believed, without being bound by theory, that the combination of predominantly rigid linkages for the benzocyclobutene groups and the absence of electronegative groups in the bisbenzocyclobutene, particularly with near stoichiometric reaction of the bismaleimide monomers, provides a polymeric crosslinked structure having a combination of high glass transition temperature and maximum toughness.

For preparation of reinforced laminate materials, a fibrous substrate of glass, carbon, quartz, poly(p-phenyleneterephthalamide), polyester, polytetrafluoroethylene, poly(p-phenylenebenzobisthiazole), boron, paper or like material, in chopped, mat or woven form, is impregnated with a bisimide/bisbenzocyclobutene composition in molten or solution form. A prepreg is formed by heating the impregnated substrate in an oven at a temperature sufficient to remove the solvent and to partially cure without gelation, or "B-stage," the resin system, generally about 180° C. to about 230° C., preferably about 200° to about 220° C., for a time of up to about 2 hours, preferably about 10 to about 40 minutes. A laminate is fabricated by subjecting a set of layered prepregs to conditions effective to cure the resins and to integrate the prepregs into a laminated structure. The laminate can optionally include one or more layers of a conductive material such as copper.

Laminating generally involves subjecting the prepregs to a temperature above about 200° C., preferably from about 210° to about 350° C., for a time of at least about 1 hour, at a pressure within the range of about 50 to about 500 psi.

For some laminating applications, it has been found advantageous to heat treat, or upstage, the BI/BCB mixture prior to application to a laminating substrate, particularly if the mixture will be stored prior to use. Suitable heat treatment involves subjecting the BI/BCB to an elevated temperature for a time sufficient to cause sufficient reaction and viscosity increase to inhibit crystallization of either or both monomers from the mixture upon storage, but not sufficient to gel the composition. Such heat treatment conditions generally include a temperature of at least about 200° C., preferably about 210° to about 230° C., for a time of at least about 10 minutes, preferably about 12 to about 90 minutes. The resulting mixture will be less tacky and less susceptible to crystallization of the components with storage.

EXAMPLE 1

Preparation of
4,4'-(1,3-phenylenedioxy)bisbenzocyclobutene

Into a 5-liter, 4-neck round bottom glass flask were weighed 205.2 grams (3.80 moles) of sodium methoxide, 220.2 grams (2.00 moles) of resorcinol, and 2500 grams of pyridine. The flask was then fitted with a paddle stirrer, stirrer rod and bearing, a thermometer, and a Vigreux column, distilling head and receiving flask for distillation. The apparatus was purged with nitrogen using a Firestone valve (U.S. Pat. No. 4,131,129) and distillation was started with stirring in order to remove methanol and form the disodium salt of resorcinol. Slow distillation was continued until the top of the column had come to constant temperature at the boiling point of pyridine. When methanol removal was complete, the Vigreux column was removed and replaced with a reflux condenser.

To the flask were then added 732.2 grams (4.00 moles) of dry 4-bromobenzocyclobutene. About 425 mL of a solution of CuCl in dry pyridine, containing about 3.6% CuCl, was placed in an addition funnel which was placed atop the flask. The system was purged again with nitrogen using the Firestone valve, 175 mL of the CuCl solution was allowed to flow into the flask, and reflux was started with gentle stirring. Reflux was continued for approximately 66 hours with periodic portionwise addition of the remaining CuCl solution. Approximately 75 mL of the remaining CuCl solution was added after 18 hours, 75 mL after 27 hours, 50 mL after 42 hours, and the remaining 50 mL after 51 hours.

The pyridine was then removed by vacuum distillation followed by removal of unreacted 4-bromobenzocyclobutene by steam distillation. The pot residue was then taken up in approximately 750 grams of cyclohexane and filtered. The cyclohexane solution was successively extracted with 300 grams each of 5%, 10%, 20%, and 40% aqueous NaOH solutions and then with 300 grams of 70% aqueous $H_2SO_4$ followed by 300 grams of water. The cyclohexane was then removed under reduced pressure on a rotary evaporator to yield 387.9 grams (1.234 moles, 64.9%) of crude 4,4'-(1,3-phenylenedioxy) bisbenzocyclobutene which crystallized on standing. Recrystallization from 550 grams of hexane yielded 272.8 grams of crystals melting at 60°-61.5° C. and with a purity of about 96% by liquid chromatography. Additional crops of crystals could be obtained by concentrating and cooling the mother liquor. Other crystallized batches of material had melting points as high as 65° C. and liquid chromatographic peak area percentages of over 98%.

EXAMPLE 2

Preparation of
4,4'-(2,7-naphthylenedioxy)bisbenzocyclobutene

Into a 2-liter, 4-neck round bottom glass flask were weighed 82.1 grams (1.52 moles) of sodium methoxide, 128.1 grams (0.80 moles) of 2,7-naphthalenediol, and 1200 grams of pyridine. The flask was then fitted with a paddle stirrer, stirrer rod and bearing, a thermometer, and a Vigreux column, distilling head and receiving flask for distillation. The apparatus was purged with nitrogen using a Firestone valve (U.S. Pat. No. 4,131,129) and distillation was started with stirring in order to remove methanol and form the disodium salt of 2,7-naphthalenediol. Slow distillation was continued until the top of the column had come to constant temperature at the boiling point of pyridine. When methanol removal was complete, the Vigreux column was removed and replaced with a reflux condenser.

To the flask were then added 293 grams (1.60 moles) of dry 4-bromobenzocyclobutene. About 250 mL of a solution of CuCl in dry pyridine, containing about 3.6% CuCl, was placed in an addition funnel which was placed atop the flask. The system was purged again with nitrogen using the Firestone valve, 75 mL of the CuCl solution was allowed to flow into the flask, and reflux was started with gentle stirring. Reflux was continued for approximately 115 hours with periodic portionwise addition of the remaining CuCl solution. Approximately 50 mL of the remaining CuCl solution was added after 28 hours, 50 mL after 56 hours, 50 mL after 80 hours, and the remaining 25 mL after 99.5 hours.

The pyridine and unreacted 4-bromobenzocyclobutene were then removed by steam distillation (in the presence of excess base, and with an air sparge to promote oxidation of unreacted phenolic materials). The pot residue was then taken up in approximately 1.5 liters of cyclohexane and filtered. The cyclohexane solution was successively extracted with 240 grams of 40% aqueous NaOH, 240 grams of 70% aqueous $H_2SO_4$, and two 200-gram portions of water. The cyclohexane was then removed under reduced pressure on a rotary evaporator to yield 163.3 grams (0.45 moles, 59.0%) of crude 4,4'-(2,7-naphthylenedioxy)bisbenzocyclobutene which crystallized on standing. Recrystallization from about 500 g of ethanol (later substituted by isopropyl alcohol) yielded 7 successive crops of crystals totaling 105.3 grams and with melting points between 83° C. and 88.5° C. The major impurities remained in an "oil" phase which never dissolved in the isopropyl alcohol.

EXAMPLE 3

Preparation of 4,4'-(1,3-phenylene)bisbenzocyclobutene

All glassware used in this experiment was dried overnight in an oven at 120° C. before use. Into a 1-liter, 4-neck round bottom glass flask were weighed 12.16 grams (0.5 mole) of magnesium turnings. The flask was then fitted with a thermometer, a condenser, a magnetic stirrer, and two addition funnels. To one addition funnel was added 91.5 grams (0.5 mole) of 4-bromobenzocyclobutene. To the other was added 250 mL of dry tetrahydrofuran. The system was purged with nitrogen. Small portions of the 4-bromobenzocyclobutene and tetrahydrofuran were dropped onto the magnesium and stirred until the Grignard reaction had started (which occured in approximately 5 minutes). The reaction mixture was then cooled with an ice-water bath and the rest of the 4-bromobenzocyclobutene and tetrahydrofuran were added over approximately 30 minutes, with continued stirring and ice-bath cooling. During this period, the temperature of the reaction mixture was 45°–55° C. The reaction mixture was then allowed to cool (without application of external heat or cooling) to room temperature over the next approximately 2½ hours as the magnesium was consumed.

Then, under a stream of nitrogen, 0.46 grams of powdered 1,2-bis(diphenylphosphino)ethanenickel(II)chloride were added to the Grignard reagent in the pot and 33 grams (0.225 mole) of 1,3-dichlorobenzene were added to one of the separatory funnels. The 1,3-dichlorobenzene was then added dropwise, with stirring, from the separatory funnel to the mixture of Grignard reagent and nickel catalyst. When addition was complete, the solution was heated to slow reflux and the reflux was continued overnight, with stirring.

The following morning, water was added to the mixture to decompose unreacted Grignard reagent. The mixture was then steam-distilled for approximately 6 hours to remove volatiles and then cooled to near room temperature. The organic portion was then taken up in approximately 200 mL of dichloromethane. The aqueous phase was then made slightly acid, the phases were separated, and the dichloromethane solution was dried over calcium chloride pellets and then evaporated in a rotary evaporator. The crude yield was 40 grams. Recrystallization from 200 mL of ethanol yielded three initial crops of crystals totaling 14 grams, which were then used in casting preparation in Example 5 below. The melting range of the crystals from the first crop was 94.5°–96° C.

EXAMPLE 4

Preparation of Copolymers

Into a perfluoropolymer beaker were weighed 50.20 grams of 4,4'-bismaleimidodiphenylmethane, 8.45 grams of 2,4-bismaleimidotoluene, 8.03 grams of 1,3-bismaleimidobenzene, and 0.2019 grams of phenothiazine (added as an inhibitor of radical polymerization of the bismaleimides on heating). The mixture was heated in an oven to 160°–180° C., stirred until homogeneous, and allowed to cool to room temperature, solidifying to an amorphous mass. The mass was then broken up into small pieces and cocured with a bisbenzocyclobutene resin as follows. (The bismaleimide mixture was used instead of a single bismaleimide resin to prevent the bismaleimide from crystallizing from its molten mixture with the bisbenzocyclobutene resin.)

A number of blends of the above bismaleimide mixture (or similar mixtures prepared by the same procedure, or mixtures which were similar in composition but without phenothiazine) with 4,4'-(1,3-phenylenedioxy)-bisbenzocyclobutene were prepared as follows. The above bismaleimide mixture and the bisbenzocyclobutene resin were weighed into 30-mL or 50-mL glass beakers in the proportions shown in Table 1 below (mixture sizes were about 10 to 12 grams). The beakers were then heated in an air oven until the contents had melted. The contents were stirred until homogeneous and in some cases were upstaged by placing the beakers in a 220° C. oil bath for 20 minutes. The mixtures were then degassed under vacuum at 180°–190° C. The mixtures were then poured into molds formed from two sheets of glass separated by a 1/16" (1.6 mm) polytetrafluoroethylene spacer and held together by clamps. The molds were then placed into an oven and cured by a number of cure cycles as shown in Table 1 below. The first group of cure cycles involved cure for approximately 2½ hours at 210° C. followed by 15 minutes at each of the following temperatures: 220° C., 230° C., 240° C., and 250° C. The second major type of cure included 3 hours at 210° C. followed by 15 minutes at each of the following temperatures: 230° C., 250° C., and 270° C., and then a 1 hour postcure at 290° C. The molds were then allowed to cool to below 150° C. and the cured resin castings were removed from the molds. Physical properties of the castings were then determined as shown in Table 1 below. The dependence of dynamic mechanical Tg and compact tension fracture toughness on composition and cure cycle is shown in FIGS. 1 and 2.

None of the samples increased in weight after immersion in methyl ethyl ketone at room temperature for as long as 2 weeks.

Figure 2:
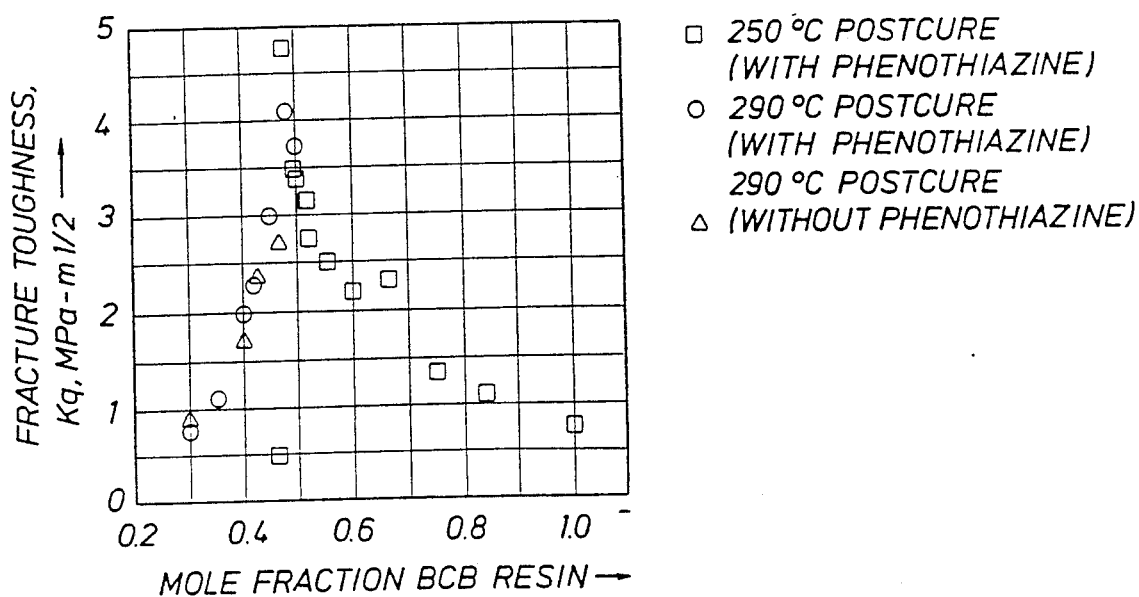
FIG. 2 plots Mode I fracture toughness versus mole fraction bisbenzocyclobutene in various bisbenzocyclobutene/bismaleimide copolymer compositions.

One can see from Table 1 and FIG. 2 the high toughness obtained for the copolymers. For all cure cycles and both with and without phenothiazine, toughness peaks fairly sharply in the region of equimolar content of BCB and maleimide groups (0.5 mole fraction BCB resin), and Tg reaches a minimum in this range. Outside this range, for mixtures with excess BCB resin and a 15-minute 250° C. postcure, toughness drops off significantly well before there is a substantial increase in Tg. For mixtures with excess BMI and a cure cycle with a 15-minute 250° C. postcure, the mixtures abruptly become extremely brittle (possibly due to the presence of large numbers of maleimide chain ends not tied into the network). With a 1-hour postcure at 290° C., system toughness is much more tolerant of excess BMI (FIG. 2), even though toughness still peaks strongly at a stoichiometric ratio of BCB to maleimide groups.

TABLE 1

Mechanical Properties of Cured Mixtures of 4,4'-(1,3-Phenylenedioxy)Bisbenzocyclobutene With a Bismaleimide Blend

| Phenothiazine used?[a] | BCB/BMI Molar ratio | BCB resin mole fraction[b] | Cure cycle[c] | Voids in casting | Dynamic mechanical: Tg (tan δ peak), °C | Rubbery plateau modulus, MPa | Compact tension fracture toughness, Kg, MPa-m^½ (ASTM E 399-83) | 93° C. water absorption, %: 24 hr. | 1 week | 2 weeks | Gel content, %[f] |
|---|---|---|---|---|---|---|---|---|---|---|---|
| 250° C. postcure: | | | | | | | | | | | |
| Yes | 0.333 | 0.250 | B | Few | d | | | | | | |
| Yes | 0.502 | 0.334 | A | Many | d | | | | | | 60.6 |
| Yes | 0.666 | 0.400 | B | | d | | | | | | |
| Yes | 0.753 | 0.429 | A | Many | d | | | | | | 63.6 |
| Yes | 0.816 | 0.449 | B | | | | | | | | |
| Yes | 0.873 | 0.466 | B | None | 235 | 2 | 0.45 ± 0.09 | | | | |
| Yes | 0.927 | 0.481 | B | Few | 245 | 1 | 4.77 ± 0.89 | | | | |
| Yes | 0.964 | 0.491 | B | Very Few | 235 | 0.9 | 3.49 ± 0.32 | | | | |
| Yes | 1.002 | 0.500 | A | Very Few | 227 | 2 | 3.40 ± 0.14 | 1.49 | 2.25 | 1.47 | 87.3 |
| Yes | 1.077 | 0.519 | C | Many | 230 | 2 | 2.75 ± 0.05 | 1.36 | 1.32 | 1.03 | |
| Yes | 1.078 | 0.519 | D | Many | 226 | 2 | 3.16 ± 0.59 | | | | |
| Yes | 1.267 | 0.559 | B | None | 228 | 2 | 2.50 ± 0.21 | 1.18 | 1.34 | 2.60 | 91.1 |
| Yes | 1.504 | 0.601 | B | Many | 227 | 2 | 2.17 ± 0.13 | 1.07 | 1.19 | 1.26 | |
| Yes | 2.006 | 0.667 | C | Few | 231 | 6 | 2.29 ± 0.72 | 0.91 | 0.99 | 1.10 | |
| Yes | 3.007 | 0.750 | B | None | 238 | 10 | 1.34 ± 0.05 | | | | |
| Yes | 5.018 | 0.834 | B | None | 250 | 17 | 1.09 ± 0.14 | 0.74 | 0.74 | 1.50 | |
| No | | 1.000 | E | None | >300 | g | 0.74 | 0.46[e] | 0.46 | 0.51 | |
| 290° C. postcure: | | | | | | | | | | | |
| Yes | 0.333 | 0.250 | F | None | 310 | g | h | | | | |
| Yes | 0.429 | 0.300 | F | Few | 302 | g | 0.76 ± 0.04 | | | | |
| No | 0.429 | 0.300 | F | None | 304 | g | 0.90 ± 0.01 | | | | |
| Yes | 0.539 | 0.350 | F | Very few | 285 | 10 | 1.10 ± 0.05 | | | | |
| Yes | 0.666 | 0.400 | F | Many | 265 | 6 | 1.95 ± 0.29 | | | | |
| No | 0.66 | 0.400 | F | None | 274 | 9 | 1.70 ± 0.06 | | | | |
| Yes | 0.745 | 0.427 | F | Few | 258 | 5 | 2.29 ± 0.09 | | | | |
| No | 0.764 | 0.433 | F | None | 246 | 5 | 2.38 ± 0.10 | | | | |
| Yes | 0.828 | 0.453 | F | Few | 248 | 4 | 3.01 ± 0.15 | | | | |
| No | 0.873 | 0.466 | F | Few | 248 | 3 | 2.72 ± 0.13 | | | | |
| Yes | 0.927 | 0.481 | F | Few | 237[i] | | 4.10 ± 0.40 | | | | |
| Yes | 1.002 | 0.501 | F | Some | 239 | 2 | 3.71 ± 0.14 | | | | |

[a] The bismaleimide component of all mixtures contained approximately 70 mole % of the unrecrystallized bismaleimide of methylenedianiline, 15 mole % of the unrecrystallized bismaleimide of 2,4-tolueneimide and 15 mole % of the bismaleimide of m-phenylenediamine. When phenothiazine was used to inhibit radical polymerization, it was incorporated at a level of 0.4 to 0.6 mole % (basis total bismaleimides).

[b] BCB resin mole fraction = (moles BCB resin)/(moles BCB resin + moles BMI resin). This quantity is shown because it is easier to plot (FIG. 1) than BCB/BMI molar ratio, since it approaches 1 rather than infinity as the BMI content of the system drops to zero. Both BCB/BMI molar ratio and BCB resin mole fraction were calculated on the assumption that the bis-BCB and BMI resins used in the formulations all contained 100% reactive difunctional species.

[c] Cure cycles:
A = 2 hr. 10 min. at 210° C., 20 min. at 220° C., 20 min. at 230° C., 25 min. at 240° C. and 15 min. at 250° C.
B = 2 hr. 30 min. at 210° C., 15 min. at 220° C., 15 min. at 230° C., 15 min. at 240° C., and 15 min. at 250° C.
C = 2 hr. 15 min. at 210° C., 15 min. at 220° C., 15 min. at 230° C., 15 min. at 240° C., and 15 min. at 250° C.
D = 48 min. at 220° C., with temperature then reduced to 210° C. for 1 hour, then 15 min. at 220° C., 15 min. at 230° C., 15 min. at 240° C. and 15 min. at 250° C.
E = 2 hr. at 210° C., 15 min. at 220° C., 15 min. at 230° C., 15 min. at 240° C., and 15 min. at 250° C.
F = 3 hr. at 210° C., 15 min. at 230° C., 15 min. at 250° C., 15 min. at 270° C., and 1 hr. at 290° C.

[d] Castings could not be tested because they were too brittle to be removed from the mold without shattering.

[e] Only one sample tested (other sample broke in test grips).

[f] The gel content was determined by soaking approximately 1 g of cured polymer in 100 mL of N-methylpyrrolidone (NMP) for 3 days at 80° C. The NMP was then decanted and replaced with 50 mL of fresh NMP and the mixture was kept at 80° C. for an additional day. The mixture was then poured into a tared fritted glass filter and the retained solids were rinsed with fresh NMP. The filter (containing the retained solids) was then dried to constant weight in a vacuum oven at 200° C.

[g] Tg was near upper temperature end of spectrum, hence no rubbery plateau module was reached.

[h] Test plaques broke during precracking procedure.

[i] Extrapolated (power failure occurred during temperature sweep shortly before Tg was reached, so this value was determined by extrapolating modulus curve).

EXAMPLE 5

This example illustrates the preparation of castings ⅛" (3.2 mm) thick via cocure of stoichiometric amounts of three bisbenzocyclobutene resins (4,4'-(1,3-phenylenedioxy)bisbenzocyclobutene, 4,4'-(2,7-naphthylenedioxy)bisbenzocyclobutene, and 4,4'-(1,3-phenylene)bisbenzocyclobutene) with bismaleimide mixtures of the type used in Example 4, and determination of the mechanical properties of the castings. Two bismaleimide mixtures of the same composition used in Example 4 were prepared as in Example 4, one with phenothiazine and the other without phenothiazine. Blends of these bismaleimide mixtures with the above bisbenzocyclobutene resins were prepared for casting as follows.

Stoichiometric amounts of the above bismaleimide mixture and the respective bisbenzocyclobutene resin were weighed into 50-mL glass beakers in the proportions shown in Table 2 below (mixture sizes were about 25-30 grams). The beakers were heated in an air oven at 210°-220° C. until the mixtures had become visually homogeneous. The mixtures were then degassed under vacuum at 180°-190° C. for about 5 minutes. The mixtures were then poured into molds (which had been preheated to 210° C.) formed from two sheets of glass separated by a ⅛" (3.2 mm) polytetrafluoroethylene spacer and held together by clamps. The molds were then placed into an oven and the castings were cured by the cure cycles shown in Table 2. (A higher postcure temperature was used for the system made from 4,4'-(1,3-phenylene)bisbenzocyclobutene because of the considerably higher final Tg of this system, 318° C. as opposed to 240° and 270° C. for the systems incorporating the phenylene diether and naphthylene diether bis-BCB resins.) The molds were then allowed to cool to below 150° C. and the cured resin castings were removed from the molds. Physical properties of the castings were then determined as shown in Table 2.

One can see from Table 2 that as one proceeds in type of bisbenzocyclobutene resin used, from 4,4'-(1,3-phenylenedioxy)bisbenzocyclobutene to 4,4'-(2,7-naphthylenedioxy)bisbenzocyclobutene to 4,4'-(1,3-phenylene)bisbenzocyclobutene (progressively increasing the ratio of "stiff" to "flexible" chain segments), the Tg steadily goes up (from 240° C. to 310° C.) with little or no loss of toughness.

During this period, the temperature of the reaction mixture was 45°–55° C.

Then, under a stream of nitrogen, a solution of 3.11 grams (0.0234 moles) of methanephosphonic dichloride in 10 grams of tetrahydrofuran was poured into one of the addition funnels. It was then added dropwise to the Grignard reagent solution over approximately 30 minutes, as the reaction mixture was cooled to keep the temperature below approximately 45° C. The reaction was then allowed to proceed at room temperature for approximately 2 hours. Approximately 125 mL of water was then added to destroy excess Grignard reagent.

The mixture was then steam-distilled to remove volatiles and the residue was dissolved in dichloromethane. The dichloromethane layer was evaporated and the

TABLE 2

| Cured Properties of Castings Produced from Mixtures of Bismaleimide Blend With Various Bisbenzocyclobutenes | | | | | |
|---|---|---|---|---|---|
| Resin used[a]: | A | A | B | B | C |
| Phenothiazine used?[b] | No | Yes | No | Yes | Yes |
| Cure cycle[c] | A | A | A | A | B |
| Mechanical properties: | | | | | |
| Tg, dry, Rheometrics tan δ peak, °C. | 242 | 235 | 273 | 270 | 310 |
| R.T. dry flex (ASTM D-790): | | | | | |
| Strength, MPa | 136 | 138 | 140 | 142 | 134 |
| Modulus, GPa | 3.93 | 3.71 | 3.44 | 3.30 | 3.74 |
| Elongation, % | 3.7 | 4.0 | 4.5 | 4.8 | 3.9 |
| 93° C. wet flex (ASTM D-790): | | | | | |
| Strength, MPa | 109[c] | 90 | 109 | | 101 |
| Modulus, GPa | 3.49[c] | 3.38 | 3.37 | | 3.16 |
| Elongation, % | 5.8[c] | 9.8 | 7.8 | | 4.0 |
| Compact tension (ASTM E 399-83): Fracture toughness, Kg, MPa · m$^{\frac{1}{2}}$ | 2.63 ± 0.04 | 4.01 ± 0.16 | 3.03 ± 0.03 | 3.42 ± 0.08 | 3.13 ± 0.07 |

[a]Resin A = 4,4'-(1,3-phenylenedioxy)bisbenzocyclobutene
Resin B = 4,4'-(2,7-naphthylenedioxy)bisbenzocyclobutene
Resin C = 4,4'-(1,3-phenylene)bisbenzocyclobutene
All mixtures contained equimolar amounts of benzocyclobutene and maleimide groups.
[b]When phenothiazine was used, it was incorporated at a level of 0.53 mole % to 0.54 mole % (basis total bismaleimides) to inhibit radical polymerization.
[c]Cure cycles:
A = 3 hours at 210° C. followed by 15 minutes at 220° C., 15 minutes at 230° C., 15 minutes at 240° C., and 2 hours at 250° C.
B = 2 hours at 210° C. followed by 15 minutes at 230° C., 15 minutes at 250° C., 15 minutes at 270° C., and 1 hour at 290° C.

EXAMPLE 6 (COMPARATIVE)

Preparation of Methylbis(4-benzocyclobutenyl)phosphine Oxide Monomer and Copolymer This comparative example shows the lack of toughness obtained when a bisbenzocyclobutene monomer containing a substituent group which fairly strongly withdraws electrons from the benzocyclobutene ring system (in this case, the methylphosphine oxide group), is copolymerized with bismaleimides at a near-stoichiometric ratio. All glassware used in this experiment was dried overnight in an oven at 120° C. before use. Into a 240-mL, 4-neck round bottom glass flask were weighed 1.2287 grams (0.0505 mole) of magnesium turnings. The flask was then fitted with a thermometer, a condenser, a magnetic stirrer, and two addition funnels. To one addition funnel was added 10.12 grams (0.0553 mole) of 4-bromobenzocyclobutene. To the other was added 25 g of dry tetrahydrofuran. The system was purged with nitrogen. Small portions of the 4-bromobenzocyclobutene and tetrahydrofuran were dropped onto the magnesium and stirred until the Grignard reaction had started (which occurred in approximately 5 minutes). The reaction mixture was then cooled with an ice-water bath and the rest of the 4-bromobenzocyclobutene and tetrahydrofuran were added over approximately 50 minutes, with continued stirring and ice-bath cooling.

residue was recrystallized from 50 mL of 1,1,1-trichloroethane. Yield after recrystallization was 4.05 grams of small matted white crystals; m.p=176°–182° C. (rapid heating); purity by HPLC=99.8%.

The dried crystals were blended, at a 1.04:1 ratio of benzocyclobutene to maleimide groups, in a beaker with a phenothiazine-containing bismaleimide mixture similar to that prepared in Example 4 (total sample size was about 2.2 grams). The beaker was placed into an oven and the mixture was melted at 200° C., with the temperature later rising to 215° C. (the latter temperature being needed in order to keep the mixture homogeneous). The mixture was then briefly degassed at 215° C. in a vacuum oven. The mixture was then poured into a mold formed from two sheets of glass separated by a 1/16" (1.6 mm) polytetrafluoroethylene spacer and held together by clamps. It was placed in an oven and cured for 70 minutes at 220° C., 20 minutes at 230° C., 10 minutes at 240° C., 10 minutes at 250° C., 10 minutes at 260° C., 10 minutes at 270° C., 10 minutes at 280° C., and 15 minutes at 290° C. The mold was then allowed to cool below 150° C. and the cured resin casting was removed from the mold. The casting was unlike the tough castings prepared in other examples from mixtures containing a near-stoichiometric ratio of benzocyclobutene to maleimide groups. The casting was extremely brittle and, indicative of the brittleness, a sliver could not be peeled from the edge of the casting with a knife.

I claim:

1. A prepreg comprising a fibrous substrate and a composition comprising
   (a) a difunctional bisimide of an unsaturated dicarboxylic acid which can be represented by the formula

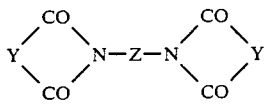

in which Y is a substituted or unsubstituted divalent group containing at least 2 carbon atoms and a carbon-carbon double bond, and Z is a divalent group containing 1 to 40 carbon atoms and
   (b) from about 0.6 to about 2.5 moles, per mole of the difunctional bisimide, of a bisbenzocyclobutene which can be represented by the formula

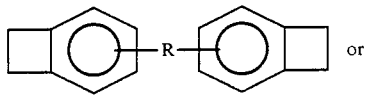 or

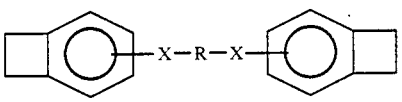

in which R is selected from unsubstituted and non-electron-withdrawing substituted phenylene, naphthalenediyl, and

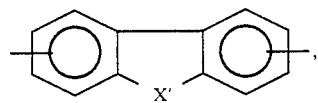

X is selected from oxygen, sulfur, nitrogen, —CH$_2$—, and —C(CH$_3$)$_2$—, and X' is selected from oxygen, sulfur, nitrogen and —CH$_2$—.

2. A process for preparing a copolymer comprising the steps of
   (a) preparing a mixture of a difunctional bisimide of an unsaturated dicarboxylic acid which can be represented by the formula

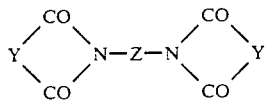

in which Y is a substituted or unsubstituted divalent group containing at least 2 carbon atoms and a carbon-carbon double bond, and Z is a divalent group containing 1 to 40 carbon atoms, and from about 0.6 to about 2.5 moles, per mole of the difunctional bisimide, of a bisbenzocyclobutene which can be represented by the formula

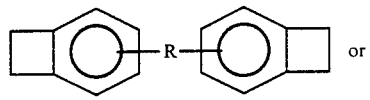 or

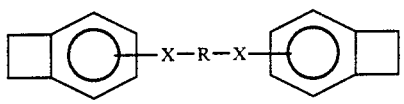

in which R is selected from unsubstituted and non-electrophilic substituted phenylene, naphthalenediyl and

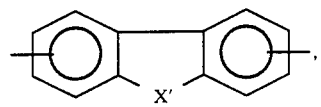

X is selected from oxygen, sulfur, nitrogen, —CH$_2$—, and —C(CH$_3$)$_2$—, and X' is selected from oxygen, sulfur, nitrogen and —CH$_2$—; and
   (b) heating said mixture to a temperature within the range of about 200° to about 350° C. for at least about 1 hour.

3. The process of claim 2 in which step (b) is carried out in a mold.

4. The process of claim 2 in which the difunctional bisimide comprises bis(4-maleimidophenyl)methane.

5. The process of claim 4 in which the difunctional bisimide further comprises at least one of 2,4-bismaleimidotoluene and 1,3-bismaleimidobenzene.

6. The process of claim 2 in which R is 1,2-, 1,3-, or 1,4-phenylene.

7. The process of claim 2 in which R is naphthalenediyl.

8. The process of claim 2 in which X is oxygen.

9. The process of claim 8 in which R is 1,2-, 1,3-or 1,4-phenylene.

10. The process of claim 8 in which R is naphthalenediyl.

11. A method for preparing a bisbenzocyclobutene/bisimide copolymer having a Mode I fracture toughness greater than 2 MPa.m$^{\frac{1}{2}}$ and a Tg greater than 200° C., the method comprising:
    (a) blending a bisimide monomer of the formula

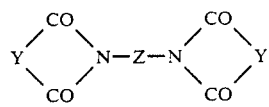

in which Y is a substituted or unsubstituted divalent group containing at least 2 carbon atoms and a carbon-carbon double bond and Z is a divalent group containing 1 to 40 carbon atoms, with from about 0.6 to about 2.5 moles, per mole of the bisimide monomer, of a bisbenzocyclobutene monomer which can be represented by one of formulas I, II and III:

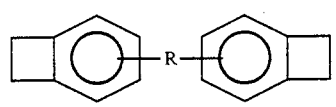 I

-continued

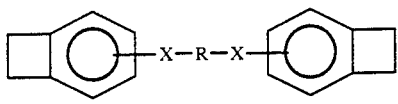

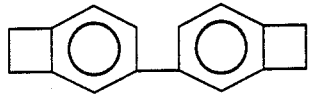

in which R is selected from phenylene, naphthalenediyl, and

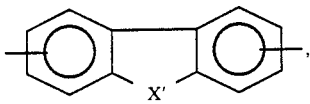

X is selected from O, N, S, —$CH_2$— and —$C(CH_3)_2$—, and X' is selected from O, N, S and —$CH_2$—;

(b) heating said monomer blend to a temperature of at least about ($Tg_u$–15° C.), where $Tg_u$ is the ultimate glass transition temperature of the bisbenzocyclobutene/bisimide copolymer, for a time sufficient for essentially complete reaction of the bisimide and the bisbenzocyclobutene monomers.

12. The method of claim 11 in which the bisimide is a bismaleimide which can be represented by the formula

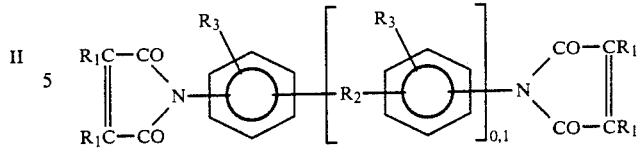

in which each $R_1$ is selected independently from H, $C_{1-2}$ alkyl or halide; $R_2$ is selected from divalent hydrocarbon radicals containing from about 1 to about 10 carbon atoms, —O—, $SO_2$—, —COO, —CONH—, —CO— and —S—; and each $R_3$ is selected independently from H, $C_{1-3}$ alkyl and halide.

13. The method of claim 11 in which X is oxygen.

14. The method of claim 11 in which R is phenylene.

15. The method of claim 11 in which the molar ratio of the bisbenzocyclobutene to the bisimide is within the range of about 0.8:1 to about 1.3:1.

16. The method of claim 15 in which the bisimide is a bis(4-maleimidophenyl)methane.

17. The method of claim 15 in which the bisbenzocyclobutene is

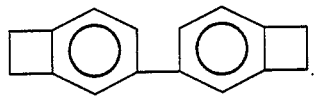

18. The method of claim 11 in which the bisbenzocyclobutene/bisimide copolymer has a Mode I fracture toughness greater than 2.5 MPa.m$^{\frac{1}{2}}$.

19. An article of manufacture comprising the composition of claim 1 and a fibrous substrate.

20. An article of manufacture comprising the copolymeric product of the process of claim 11 and a fibrous substrate.

* * * * *